United States Patent
Takeuchi et al.

(10) Patent No.: US 6,813,295 B2
(45) Date of Patent: Nov. 2, 2004

(54) ASYMMETRIC INGAASN VERTICAL CAVITY SURFACE EMITTING LASERS

(75) Inventors: Tetsuya Takeuchi, Sunnyval, CA (US); Ying-Lan Chang, Cupertino, CA (US); David P. Bour, Cupertino, CA (US); Michael H. Leary, Fremont, CA (US); Michael R. T. Tan, Menlo Park, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/106,678

(22) Filed: Mar. 25, 2002

(65) Prior Publication Data

US 2003/0179801 A1 Sep. 25, 2003

(51) Int. Cl.[7] .............................. H01S 5/00; H01S 3/08
(52) U.S. Cl. ........................................... 372/45; 372/96
(58) Field of Search ............................ 372/43–46, 96; 438/45; 257/98, 43

(56) References Cited

U.S. PATENT DOCUMENTS

| | | | |
|---|---|---|---|
| 50,934 A | | 11/1865 | Choquetta et al. |
| 5,583,351 A | * | 12/1996 | Brown et al. ................. 257/89 |
| 5,710,439 A | * | 1/1998 | Ohkubo ....................... 257/85 |
| 5,903,586 A | | 5/1999 | Ramdani et al. |
| 5,912,913 A | * | 6/1999 | Kondow et al. .............. 372/45 |
| 5,978,398 A | * | 11/1999 | Ramdani et al. ............. 372/45 |
| 6,015,979 A | * | 1/2000 | Sugiura et al. .............. 257/86 |
| 6,049,556 A | * | 4/2000 | Sato ............................ 372/46 |
| 6,207,973 B1 | * | 3/2001 | Sato et al. ................... 257/98 |
| 6,238,944 B1 | * | 5/2001 | Floyd .......................... 438/45 |
| 6,304,588 B1 | * | 10/2001 | Chua et al. .................. 372/46 |
| 6,306,672 B1 | * | 10/2001 | Kim ............................ 438/22 |
| 6,455,340 B1 | * | 9/2002 | Chua et al. .................. 438/31 |
| 2001/0050934 A1 | * | 12/2001 | Choquette et al. ........... 372/43 |
| 2002/0034203 A1 | * | 3/2002 | Shimizu et al. .............. 372/45 |
| 2002/0105988 A1 | * | 8/2002 | Park et al. ................... 372/45 |
| 2003/0013224 A1 | * | 1/2003 | Shimizu et al. .............. 438/47 |
| 2003/0108075 A1 | * | 6/2003 | Kim et al. ................... 372/45 |

OTHER PUBLICATIONS

Kawaguchi et al., "Lasing Characteristics of Low–Threshold GaInNAs Laser Grown by Metalorganic Chemical Vapor Deposition", Japan Journal of Applied Physics, vol. 40(2001) pp. 744–746, no month.

Kageyama et al., "High–Temperature Operation up to 170 Degrees C of GaInNAs–GaAs Quantum–Well Lasers Grown by Chemical Beam Epitaxy", IEEE Photonics Technology Letters, vol. 12, No. 1, Jan. 2000, pp. 10–12.

Sato et al. "Continuous Wave Operation of 1.26um GaIn-NAs/GaAs Vertical–Cavity Surface–Emitting Lasers Grown by Metalorganic Chemical Vapour Deposition", Electronic Letters, Nov. 23, 2000, vol. 36, No. 24, pp. 2018–2019.

Harris, J.S. Jr., "GaInNAs, a New Material for Long Wavelength VCSELs", 10th Seoul Interlational Symposium on Physics of Semicondcutors and Application, Nov. 1–3, 2000, p. 1, no month.

* cited by examiner

Primary Examiner—Don Wong
Assistant Examiner—Hung Tran Vy

(57) ABSTRACT

Various asymmetric InGaAsN VCSEL structures that are made using an MOCVD process are presented. Use of the asymmetric structure effectively eliminates aluminum contamination of the quantum well active region.

27 Claims, 4 Drawing Sheets

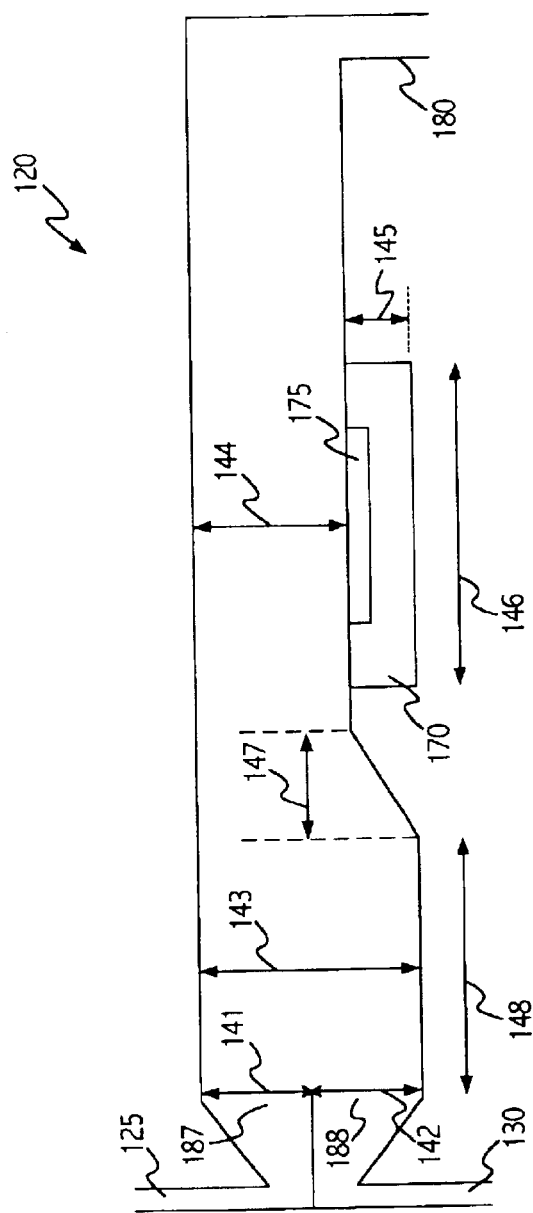
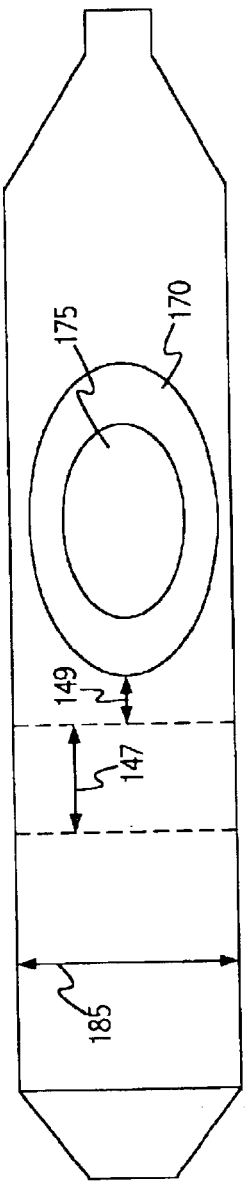
FIGURE 1A
FIGURE 1B

ASYMMETRIC INGAASN VERTICAL CAVITY SURFACE EMITTING LASERS

CROSS REFERENCE TO RELATED APPLICATIONS

This application relates to the co-pending application Ser. No. 10/106,472 filed on the same day, entitled "Method for Obtaining High Quality InGaAsN Semiconductor Devices" by Takeuchi, Chang, Luan, Bour, Leary and Tan, owned by the assignee of this application and incorporated herein by reference.

BACKGROUND

Long wavelength vertical cavity surface emitting lasers (VCSELs) are attractive for long reach optical communication applications. Fabrication of long wavelength VCSELs incorporating well-developed AlAs/GaAs distributed Bragg reflectors (DBRs) is achieved by growing highly strained InGaAsN active regions on GaAs. Long wavelength VCSEL structures include structures where InGaAsN active regions are sandwiched between a first and second cladding region of AlGaAs/GaAs or InGaP/GaAs and top and bottom AlGaAs/GaAs DBR mirror layers.

Research by Kawaguchi et al. in Electronics Letters, 36, 2000, 1776 indicates that the material quality of metal-organic chemical vapor deposition (MOCVD) InGaAsN is severely degraded if the InGaAsN quantum well active layer is grown directly on the AlGaAs/GaAs DBR and lower cladding layers. To achieve acceptable material quality for the quantum well active layer, two separate reactors are used to grow the wafers for 1.3 µm wavelength VCSELs with InGaAsN quantum well active layers. A first reactor is used to grow the AlGaAs/GaAs DBR and lower cladding layers. Subsequently, the wafer is transferred to a second reactor for the growth of InGaAsN quantum well active layers, the top cladding layer and the top DBR mirror layers. These long wavelength InGaAsN VCSELs have "symmetric" structures where both the top and bottom cladding layers have the same composition. Sato et al. in Electronics Letters, 36, 2000, 2018 disclose an "asymmetric" VCSEL structure grown in a two reactor MOCVD process where a GaInP layer functions as an etch stop.

SUMMARY OF INVENTION

The use of an InGaAsN quantum well active layer allows VCSEL operation in the important 1300 nm or longer wavelength regime which is of interest for telecommunications and Internet infrastructure applications. In accordance with the invention, an asymmetric InGaAsN VCSEL structure may be made which allows all growth steps to be performed in the same metal-organic chemical vapor deposition (MOCVD) reactor.

In the asymmetric VCSEL structure, the first AlGaAs/GaAs DBR mirror layer is followed by growth of a sufficiently thick nitrogen or nitrogen and phosphorus containing layer such as GaAsN, InGaAsPN, GaAsPN, GaAsN, AlGaAsN, InGaPN, or similar compositions to improve growth of the InGaAsN quantum well active layer by serving to getter Al while not interrupting the MOCVD growth process. The top cladding layer may be AlGaAs to provide for higher band offset resulting in better electron confinement than is provided by a nitrogen or phosphorus containing cladding layer. However, AlGaAs requires a more complicated growth structure and typically GaAs is used for the top cladding layer. Instead of using a C-doped GaAs contact layer, a reverse-biased tunnel junction can be used to form the p-contact to reduce resistance and optical losses.

Using an asymmetric InGaAsN VCSEL structure results in the InGaAsN quantum well active layer having a quality that is comparable to that achieved by the conventional two reactor MOCVD process while providing good laser performance along with lower production costs by using a single reactor MOCVD process.

BRIEF DESCRIPTION OF THE DRAWINGS

FIG. 1a shows a side view of a typical MOCVD reactor in accordance with the invention.

FIG. 1b shows a top view of a typical MOCVD reactor in accordance with the invention.

DETAILED DESCRIPTION OF INVENTION

Figure 2:
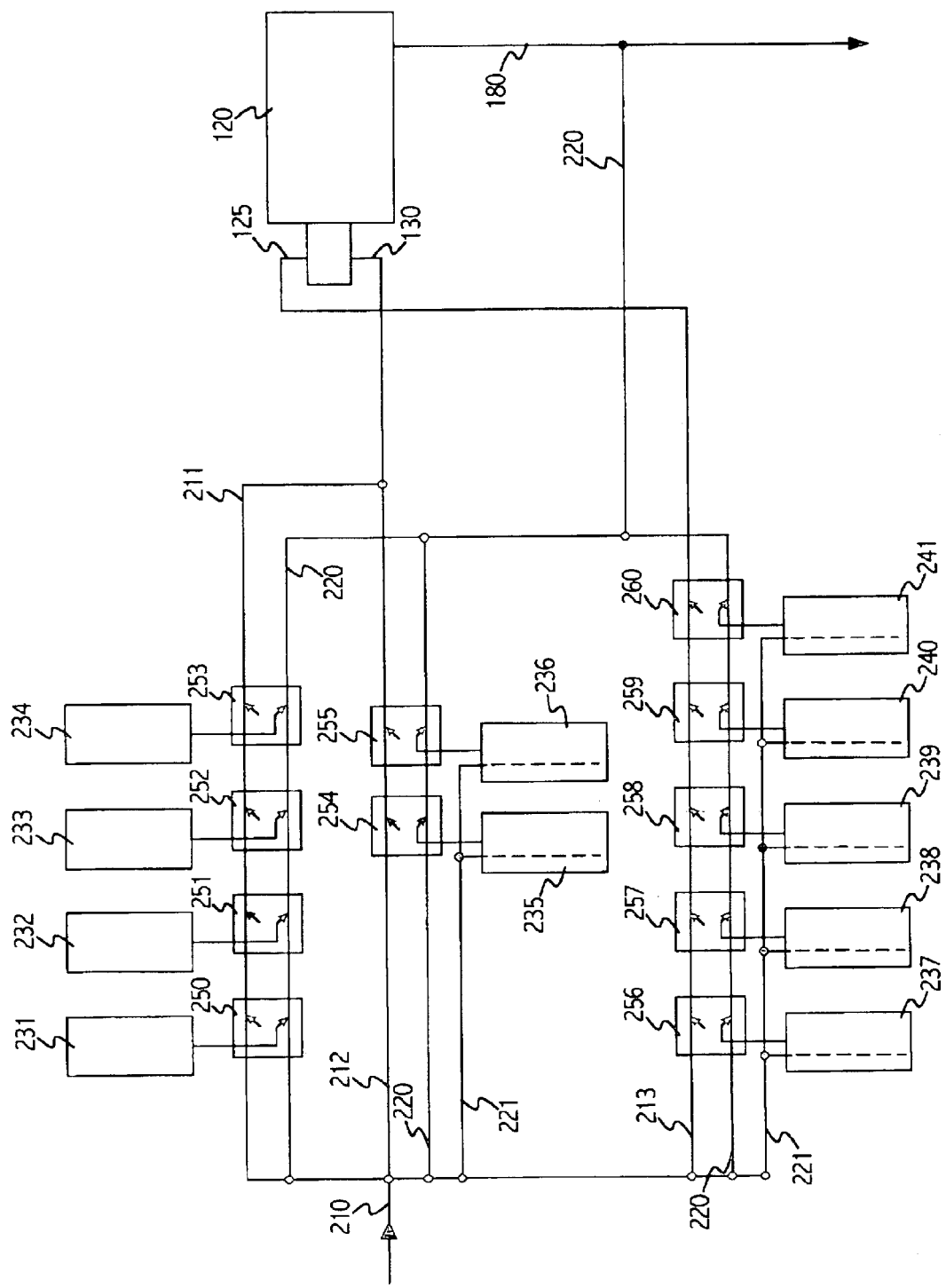
FIG. 2 shows arrangement of the chemical delivery system for the typical MOCVD reactor in FIG. 1a and FIG. 1b

In accordance with the invention, FIG. 1a shows MOCVD reactor 120 in side view with exhaust line 180. MOCVD reactor 120 is a cold wall, quartz reactor. Group III source injection occurs at inlet 125 and Group V source injection occurs at inlet 130. Group III and Group V gases begin mixing after passing from outlets 187 and 188. Outlets 187 and 188 are both approximately 13 cm×2 cm rectangles. Vertical height 143 of MOCVD reactor 120 is approximately 4.5 cm while dimension 144 is approximately 3 cm. Dimension 148 is approximately 7 cm and is the distance from where the Group III and Group V gases begin to mix to where the vertical constriction of MOCVD reactor 120 starts. Dimension 147 is approximately 7 cm and Si-coated graphite susceptor 170 has diameter 146 of approximately 11 cm with thickness 145 of approximately 1.5 cm. Substrate 175 is positioned on susceptor 170 as shown in FIGS. 1a and 1b. With reference to FIG. 1b, lateral dimension 185 of MOCVD reactor 120 is approximately 13 cm while dimension 149 is approximately 1.5 cm.

In accordance with the invention, FIG. 2 shows an arrangement of the chemicals and lines feeding into MOCVD reactor 120. MOCVD reactor 120 is typically a cold wall, quartz reactor. Valves 250, 251, 252 and 253 control and direct flow from tanks 231, 232, 233, and 234, respectively. Valves 254, 255, 256, 257, 258, 259 and 260 control and direct flow from bubblers 235, 236, 237, 238, 239, 240 and 241, respectively. Inlet 210 serves to introduce $H_2$ carrier gas into MOCVD reactor 120 via line 212 to inlet 130 of MOCVD reactor 120. Line 212 serves as well for typically introducing Tertiarybutylarsine (TBAs) from bubbler 235 and Dimethylhydrazine (DMHy) from bubbler 236 into MOCVD reactor 120 via inlet 130. Valves 254 and 255 direct flow from bubblers 235 and 236, respectively, into either line 212 or vent line 220. Vent lines 220 connect to exhaust line 180. Line 221 serves to introduce $H_2$ into bubblers 235 and 236 while line 222 serves to introduce $H_2$ into bubblers 237, 238, 239, 240 and 241. Line 211 serves to introduce $NH_3$ from tank 231, $AsH_3$ from tank 232, $PH_3$ from tank 233 and $Si_2H_6$ from tank 234 into MOVCD reactor 120 via inlet 130.

Valves 250, 251, 252 and 253 direct flow from tanks 231, 232, 233 and 234, respectively, into either line 211 or vent line 220. Line 213 serves to typically introduce Trimethylgalium (TMGa) from bubbler 237, Triethylgallium (TEGa) from bubbler 238, Trimethyaluminum (TMAl) from bubbler 239, Trimethylindium (TMIn) from bubbler 240 and $CBr_4$ from bubbler 241 into MOCVD reactor 120 via inlet 125. Valves 256, 257, 258, 259 and 260 direct flow from bubblers 237, 238, 239, 240 and 241, respectively, into either line 213 or vent line 220. Note that there is no back flow in any of the lines since a mechanical pump (not shown) maintains the pressure inside reactor 120 at about 100 mbar.

Figure 3:
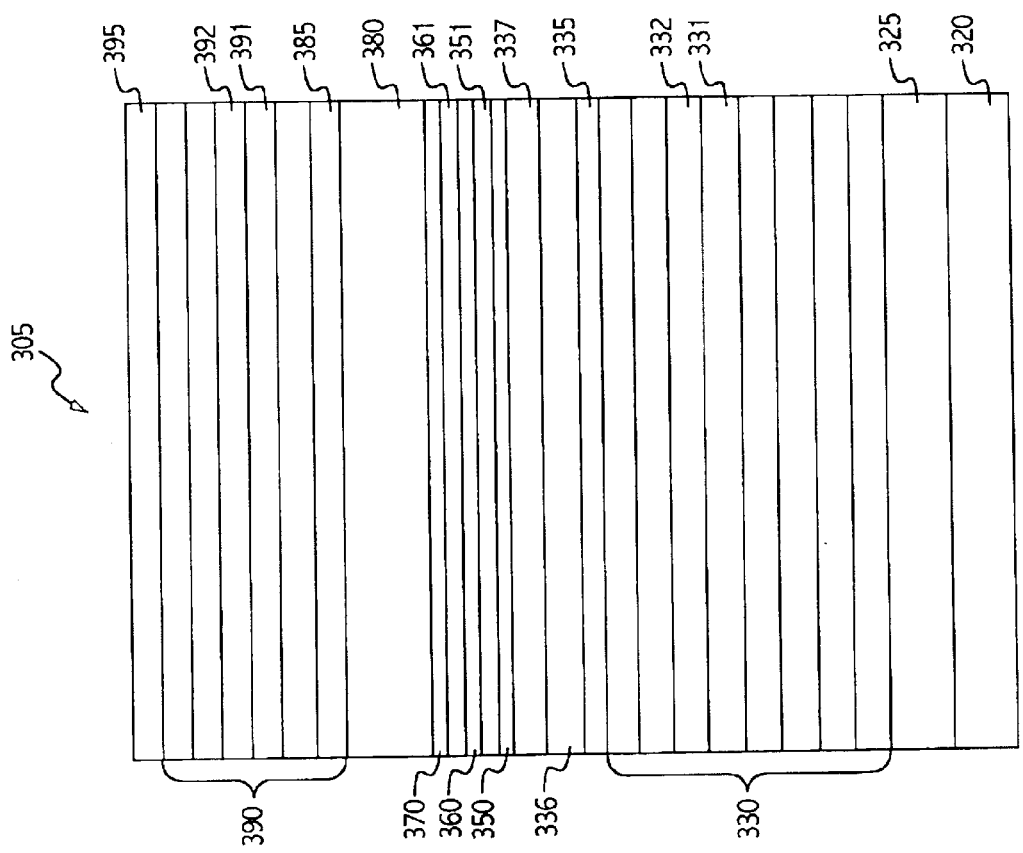
FIG. 3 shows an embodiment in accordance with the invention.

In accordance with an embodiment of the invention, asymmetric VCSEL structure 305 shown in FIG. 3 is grown by using an MOCVD reactor such as MOCVD reactor 120 shown in FIGS. 1a and 1b. With reference to MOCVD reactor 120, Si-doped GaAs buffer layer 325 with a doping level typically in the range of $1.0 \times 10^{17}$–$5.0 \times 10^{18}$ $cm^{-3}$ is grown on GaAs substrate 320 to a thickness typically in the range of about 1000–5000 Å at a typical temperature of about 600–800° C. Following growth of Si-doped GaAs buffer layer 325, bottom n-type DBR mirror structure 330 is grown. N-type DBR mirror structure 330 is typically made up of about 35–45 pairs of alternating layers of which Si-doped $Al_{0.9}Ga_{0.1}As$ layer 331 and Si-doped GaAs layer 332 are representative with Si-doping typically in the range of $5.0 \times 10^{17}$–$5.0 \times 10^{18}$ $cm^{-3}$. Si-doped $Al_xGa_{1-x}As$ layer 331 where x is between about 0.8 and 1.0 is typically grown to a thickness corresponding to one quarter wavelength (of the emission wavelength) and Si-doped GaAs layer 332 is also typically grown to a thickness corresponding to one quarter wavelength with about 100–300 Å of grading at each interface. The grading profile is typically linear with distance from the interface. The grading serves to lower the hetero barrier between AlGaAs and GaAs layers resulting in lower operating voltages for the VCSEL device. The total amount of TMAl typically supplied to MOCVD reactor 120 for growth of all Si-doped $Al_{0.9}Ga_{0.1}As$ type layers 331 layers in n-type DBR mirror structure 330 is about $7 \times 10^{-3}$ mol.

After completion of the growth for n-type DBR mirror structure 330, GaAs layer 335 is grown to a thickness in the range of about 50–300 Å at a temperature typically in the range of 600–800° C. Following growth of GaAs layer 335, $GaAs_{1-x}N_x$ layer 336 is grown to a typical thickness of about 600 Å where x is between 0 and 0.1. TMGa, 100 sccm, $AsH_3$, and 500 sccm of $NH_3$ are supplied for about 4 minutes while the growth temperature is decreased to about 500–550° C. from 600–800° C. in growing $GaAs_{1-x}N_x$ layer 336. The total amount of $NH_3$ introduced is typically about $8 \times 10^{-2}$ mol which is approximately ten times larger than the amount of TMAl that is typically supplied for the growth of all Si-doped $Al_{0.9}Ga_{0.1}As$ type layers 331 that make up DBR mirror structure 330 when using MOCVD reactor 120. $NH_3$ serves to getter the Al which would interfere with growth of InGaAsN quantum well active layers 350, 360 and 370 and can be replaced, for example, by Monomethylamine, Dimethylamine, Diethylamine, Tertiarybutylamine, hydrazine, Monomethylhydrazine, Dimethylhydrazine, Tertiarybutylhydrazine, Phenylhydrazine, phosphine or Tertiarybutylphosphine. In accordance with the invention, $GaAs_{1-x}N_x$ in layer 336 may be replaced, for example, by GaAsNP, InGaAsPN, InGaAsN, or similar compositions. GaAs cladding layer 337 is grown over $GaAs_{1-x}N_x$ layer 336 to a typical thickness in the range of about 700–900 Å but greater than about 200 Å. Alternatively, Si-doped $GaAs_{1-x}N_x$ layer 336 may be grown embedded in one or more of Si-doped GaAs layers 332 of DBR mirror structure 330 having a typical thickness of about 600 Å. In addition, an Si-doped $AlGaAs_{1-x}N_x$ layer may be grown embedded in one or more of Si-doped $Al_{0.9}Ga_{0.1}As$ layers 331 having a typical thickness of about 600 Å.

Then InGaAsN quantum well active layer 350 is grown to a thickness in the range of about 60–100 Å using TEGa, TMIn, TBAs and DMHy. The ratio of DMHy/(DMHy+ TBAs) in the range of about 0.95–0.99 is typically used for growth of InGaAsN quantum well active layer 350. GaAs barrier layer 351 is grown over InGaAsN quantum well active layer 350 to a thickness in the range of 50–300 Å. Then quantum well active layer 360 is grown to a typical thickness in the range of about 60–100 Å using TEGa, TMIn, TBAs and DMHy. The ratio of DMHy/(DMHy× TBAs) in the range of about 0.95–0.99 is typically used for growth of InGaAsN quantum well active layer 360. GaAs barrier layer 361 is grown over InGaAsN quantum well active layer 360 to a thickness in the range of 50–300 Å. Then InGaAsN quantum well active layer 370 is grown to a thickness in the range of about 60–100 Å using TEGa, TMIn, TBAs and DMHy. The ratio of DMHy/(DMHy+ TBAs) in the range of about 0.95–0.99 is typically used for growth of InGaAsN quantum well active layer 370. The total number of quantum wells as well as the thickness of quantum well active layers 350, 360, 370 and barrier layers 351, 361 may be adjusted to obtain the best results. The distance from the first quantum well active layer, for example, quantum well active layer 350 to the last quantum well active layer, for example, quantum well active layer 370 is fixed to be no greater than 600 Å. The thickness of GaAs cladding layer 337 and GaAs layer 380 is typically adjusted appropriately in order to put the layers extending from the first quantum well layer to the last quantum well layer, for example, quantum well active layer 350 to quantum well active layer 370, at a maximum of the standing wave cavity.

After growth of InGaAsN quantum well active layer 370, GaAs layer 380 is grown to thickness in the range of about 1500–1700 Å while the temperature is typically increased to about 600–800° C. Then p-type DBR mirror structure 390 is grown. P-type DBR mirror structure 390 is made up of about 20–35 pairs of alternating layers of which C-doped $Al_xGa_{1-x}As$ layer 391 and C-doped GaAs layer 392 are representative layer pairs with x typically in the range of between about 0.8 and 1 and with C-doping typically in the range of $5.0 \times 10^{17}$–$5.0 \times 10^{18}$ $cm^{-3}$. C-doped $A_xGa_{1-x}As$ layer 391 is grown to a typical thickness corresponding to one quarter of the emission wavelength. C-doped $Al_yGa_{1-y}As$ layer 392 where y is typically in the range of 0 to less than 0.2 is grown to a typical thickness corresponding to one quarter of the emission wavelength with about 100–300 Å of linear grading at each interface. Finally, the growth is completed by growing heavily C-doped GaAs contact layer 395 to a thickness in the range of about 500–1000 Å. C-doped GaAs contact layer 395 is typically doped in the range of $5.0 \times 10^{18}$–$1.0 \times 10^{20}$ $cm^{-3}$.

Typically, C-doped $Al_xGa_{1-x}As$ layer 385 is used to make the laterally oxidized layer for the purposes of optical confinement and current confinement, if desired. The value of x for C-doped $Al_xGa_{1-x}As$ layer 385 is selected to be higher than the value of x selected for typical C-doped $Al_xGa_{1-x}As$ layer 391 since the rate of oxidation is strongly dependent on the Al content of C-doped $Al_xGa_{1-x}As$ layer 385. See, for example, U. S. Pat. No. 5,896,408, incorporated by reference in its entirety, for details. Ion implantation is used to realize current confinement either alone or in conjunction with laterally oxidized layer 385.

Figure 4:
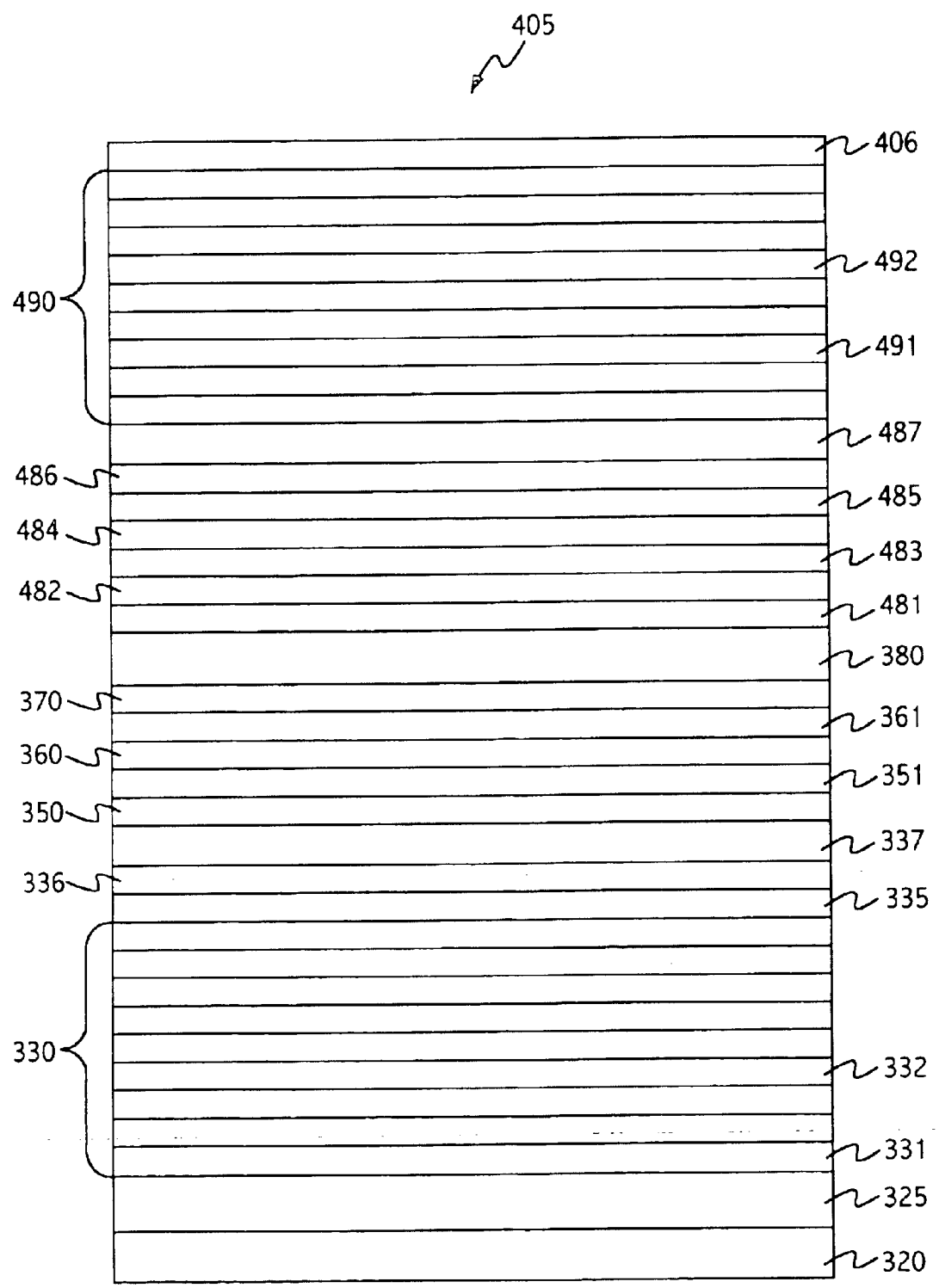
FIG. 4 shows an embodiment in accordance with the invention.

In accordance with an embodiment of the invention, a reverse-biased tunnel junction can be utilized as a p-contact instead of C-doped GaAs contact layer 395. This allows high current flow at a low bias voltage as well as low absorption of emission light in n-type DBR 490. FIG. 4 shows asymmetric VCSEL structure 405 utilizing a reverse-biased tunnel junction. Sidoped GaAs buffer layer 325 with a doping level typically in the range of $1.0 \times 10^{17}$–$5.0 \times 10^{18}$ cm$^{-3}$ is grown on GaAs substrate 320 to a thickness in the range of 1000–5000 Å at a temperature of about 600–800° C. Following growth of Si-doped GaAs buffer layer 325, bottom n-type DBR mirror structure 330 is grown. N-type DBR mirror structure 330 is typically made up of about 35–45 pairs of alternating layers of which Sidoped $Al_xGa_{1-x}As$ layer 331 and Si-doped GaAs layer 332 are typical with Si-doping typically in the range of $5.0 \times 10^{17}$–$5.0 \times 10^{18}$ cm$^{-3}$. Si-doped $Al_xGa_{1-x}As$ layer 331 where x is between about 0.8 and 1.0 is grown to a thickness corresponding to one quarter wavelength (of emission wavelength) and Si-doped GaAs layer 332 is also grown to a thickness corresponding to one quarter wavelength length with about 100–300 Å of grading at each interface. The grading profile is typically linear with distance from the interface. The grading serves to lower hetero barrier between AlGaAs and GaAs layers resulting in lower operating voltages for the VCSEL device. The total amount of TMAl typically supplied to MOCVD reactor 120 for growth of all Si-doped $Al_{0.9}Ga_{0.1}As$ type layers 331 in n-type DBR mirror structure 330 is about $7 \times 10^{-3}$ mol.

After completion of the growth for n-type DBR mirror structure 330, GaAs layer 335 is grown to a thickness in the range of about 50–300 Å. Following growth of GaAs layer 335, $GaAs_{1-x}N_x$ non-active layer 336 is grown to a typical thickness of about 600 Å where x is between 0 and 0.1. TMGa, 100 sccm, AsH$_3$, and 500 sccm of NH$_3$ are supplied for about 4 minutes while the growth temperature is decreased to about 500–550° C. from 600–800° C. in growing $GaAs_{1-x}N_x$ layer 336. The totalamount of NH$_3$ introduced is typically about $8 \times 10^{-3}$ mol which is approximately ten times larger than the amount of TMAl that is typically supplied for the growth of all Si-doped $Al_{0.9}Ga_{0.1}As$ type layers 331 that make up DBR mirror structure 330 when using MOCVD reactor 120. NH$_3$ serves to getter the Al which would interfere with growth of InGaAsN quantum well active layers 350, 360 and 370 and can be replaced, for example, by Monomethylamine, Dimethylamine, Diethylamine, Tertiarybutylamine, hydrazine, Monomethylhydrazine, Dimethylhydrazine, Tertiarybutylhydrazine or Phenylhydrazine. In accordance with the invention, $GaAs_{1-x}N_x$ in layer 336 may be replaced, for example, by GaAsNP, InGaAsPN, InGaAsN, or similar compositions. GaAs cladding layer 337 is grown over $GaAs_{1-x}N_x$ non-active layer 336 to a typical thickness in the range of about 700–900 Å but greater than about 200 Å so that the combined thickness of $GaAs_{1-x}N_x$ non-active layer 336 and GaAs cladding layer 337 is in the range of from about 1000–2000 Å.

Then active layer 350 is grown to a thickness in the range of about 60–100 Å using TEGa, TMIn, TBAs and DMHy. The ratio of DMHy/(DMHy+TBAs) in the range of about 0.95–0.99 is typically used for growth of InGaAsN active layer 350. GaAs barrier layer 351 is grown over InGaAsN active layer 650 to a thickness in the range of 100–300 Å. Then active layer 360 is grown to a thickness in the range of about 60–100 Å using TEGa, TMIn, TBAs and DMHy. The ratio of DMHy/(DMHy+TBAs) in the range of about 0.95–0.99 is typically used for growth of InGaksN active layer 360. GaAs barrier layer 361 is grown over InGaAsN quantum well active layer 360 to a thickness in the range of 100–300 Å. Then quantum well active layer 370 is grown to a thickness in the range of about 60–100 Å using TEGa, TMIn, TBAs and DMHy. The ratio of DMHy/(DMHy+ TBAs) in the range of about 0.95–0.99 is typically used for growth of InGaAsN active layer 370. The total number of quantum wells as well as quantum well active layer and barrier layer thickness may be adjusted to obtain the best results. The distance from the first quantum active layer to the last quantum well active layer is fixed to be no more than about 600 Å and the thickness of GaAs cladding layer 337 and GaAs layer 380 is adjusted appropriately in order to put the active region at a maximum of the standing wave cavity.

After growth of InGaAsN active layer 370, GaAs layer 380 is grown to thickness in the range of about 1000–2000 Å while the temperature is typically increased to about 600–800° C. Then C-doped $Al_{0.9}Ga_{0.1}As$ layer 481 is grown to a typical thickness of about 260 Å, C-doped $Al_xGa_{1-x}As$ layer 482 is grown to a typical thickness of about 100 Å and C-doped $Al_{0.9}Ga_{0.1}As$ layer 483 is grown to a typical thickness of about 260 Å to make the laterally oxidized layer structure for the purpose of providing optical confinement and current confinement. Two graded interfaces, with a thickness of about 100–300 Å, are grown between GaAs layer 380 and C-doped $Al_{0.9}Ga_{0.1}As$ layer 481 and between C-doped $Al_{0.9}Ga_{0.1}As$ layer 483 and C-doped GaAs layer 484. C-doped GaAs layer 484 is grown to a typical thickness in the range of 50–100 A.

The value of x for C-doped $Al_xGa_{1-x}As$ layer 482 is selected to be higher than the value of x selected for any other C-doped $Al_xGa_{1-x}As$ layers in the structure since the rate of oxidation is strongly dependent on the Al content of C-doped $Al_xGa_{1-x}As$ layer 482. See, for example, U.S. Pat. No. 5,896,408, incorporated by reference in its entirety, for details. Ion implantation may also be used to realize current confinement either alone or in conjunction with laterally oxidized layer structure.

The tunnel junction which consists of heavily C-doped GaAs layer 485 grown to a typical thickness of about 200 A with C-doping typically in the range of about $2.0 \times 10^{19}$ to $2.0 \times 10^{20}$ cm$^{-3}$ and heavily Si-doped $In_xGa_{1-x}As$ layer 486, where x is in the range of about 0 to 0.2, is grown to a typical thickness of about 100–200 Å with Si doping typically in the range of about $1.0 \times 10^{18}$ to $1.0 \times 10^{20}$ cm$^{-3}$. The use of the tunnel junction allows better lateral current spreading at the n-layers on the top of the tunnel junction as well as much lower absorption loss of emission light at top n-type DBR mirror structure 490 compared to a p-type DBR mirror structure. Then, Si-doped GaAs layer 487 with a thickness in the range of about 500–600 A is grown on $In_xGa_{1-x}As$ layer 486 with Si doping typically in the range of about $1.0 \times 10^{17}$ to $1.0 \times 10^{18}$ cm$^{-3}$. The tunnel junction is located at a minimum of the standing wave in the laser cavity to minimize the absorption loss at the tunnel junction by adjusting the thickness of the GaAs layer 380 and Si-doped GaAs layer 487.

Then n-type DBR mirror structure 490 is grown. N-type DBR mirror structure 490 is made up of about 20–35 pairs of alternating layers of which Si-doped $Al_xGa_{1-x}As$ layer 491 and Si-doped GaAs layer 492 are typical layer pairs with x between 0.8 and 1 and with Si-doping typically in the range of $5.0 \times 10^{17}$–$5.0 \times 10^{18}$ cm$^{-3}$. Si-doped $Al_xGa_{1-x}As$ layer 491 is grown to a thickness corresponding to one quarter of the emission wavelength. Si-doped GaAs layer 492 is also grown to a thickness corresponding to one quarter of the emission wavelength with about 100–300 Å of linear grading at each interface. Finally, the growth is completed by growing heavily Si-doped GaAs contact layer

406 to a thickness in the range of about 500–1000 Å. Si-doped GaAs contact layer 406 is typically doped in the range of $5.0 \times 10^{18} - 1.0 \times 10^{20}$ cm$^{-3}$.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. An asymmetric vertical cavity surface emitting laser structure comprising:
    a substrate;
    a plurality of semiconductor layers formed on said substrate;
    one of said semiconductor layers comprising a quantum well active layer;
    a first reflector comprising Al located on one side of said quantum well active layer and a second reflector located on the opposite side of said quantum well active layer; and
    one of said semiconductor layers being an unpaired non-active layer comprising nitrogen, said unpaired non-active layer comprising nitrogen being located between said quantum well active layer and said first reflector creating a layer asymmetry about said quantum well active layer.

2. The asymmetric vertical cavity surface emitting laser of claim 1 wherein said non-active layer is separated from said quantum well active layer by a distance of at least about 200 Å.

3. The asymmetric vertical cavity surface emitting laser structure of claim 1 wherein said non-active layer comprises Al, Ga, As and N.

4. The asymmetric vertical cavity surface emitting laser structure of claim 1 wherein said non-active layer comprises $GaAs_{1-x}N_x$.

5. The asymmetric vertical cavity surface emitting laser structure of claim 4 wherein the value of x lies between 0 and 0.1.

6. The asymmetric vertical cavity surface emitting laser structure of claim 1 wherein said non-active layer comprising nitrogen has a thickness of about 600 Å.

7. The asymmetric vertical cavity surface emitting laser structure of claim 1 with said quantum well active layer comprising In, Ga, As and N.

8. The asymmetric vertical cavity surface emitting laser structure of claim 1 with two of said plurality of semiconductor layers comprising a tunnel junction.

9. The asymmetric vertical cavity surface emitting laser structure of claim 1 wherein said non-active layer comprising nitrogen further comprises InGaP.

10. The asymmetric vertical cavity surface emitting laser structure of claim 1 with two of said plurality of semiconductor layers comprising a tunnel junction.

11. An asymmetric vertical cavity surface emitting laser structure comprising:
    a substrate comprising GaAs;
    a plurality of semiconductor layers formed on said substrate;
    a plurality of said plurality of semiconductor layers being quantum well active layers, said quantum well active layers comprising In, Ga, As and N;
    a first reflector located on one side of said quantum well active layers and a second reflector located on the opposite side of said quantum well active layers;
    a first cladding layer located between said first reflector and said quantum well active layers;
    a second cladding layer positioned between said second reflector and said quantum well active layers; and
    one of said semiconductor layers being a non-active layer comprising nitrogen, said non-active layer comprising nitrogen located between said first cladding layer and said first reflector creating a layer asymmetry about said quantum well active layer.

12. The asymmetric vertical cavity surface emitting laser of claim 11 wherein said non-active layer is separated from said quantum well active layers by a distance of at least about 200 Å.

13. The asymmetric vertical cavity surface emitting laser structure of claim 11 with said quantum well active layers comprising In, Ga, As and N.

14. The asymmetric vertical cavity surface emitting laser structure of claim 11 with said first cladding layer comprising Ga and As.

15. An asymmetric vertical cavity surface emitting laser structure comprising:
    a substrate;
    a plurality of semiconductor layers formed on said substrate;
    one of said semiconductor layers comprising an quantum well active layer;
    a first reflector located on the same side of said quantum well active layer as said substrate and a second reflector located on the opposite side of said quantum well active layer;
    a first cladding layer located between said first reflector and said quantum well active layer;
    a second cladding layer positioned between said second reflector and said quantum well active layer; and
    one of said semiconductor layers being a non-active layer comprising In, Ga, As, P and N, said non-active layer located between said first cladding layer and said first reflector.

16. The asymmetric vertical cavity surface emitting laser structure of claim 15 wherein said non-active layer has a thickness of about 600 Å.

17. The asymmetric vertical cavity surface emitting laser of claim 15 wherein said non-active layer is separated from said quantum well active layer by a distance of at least about 200 Å.

18. The asymmetric vertical cavity surface emitting laser structure of claim 15 wherein said non-active layer comprises $GaAs_{1-x}N_x$.

19. The asymmetric vertical cavity surface emitting laser structure of claim 18 wherein the value of x lies between 0 and 0.1.

20. The asymmetric vertical cavity surface emitting laser structure of claim 15 with two of said plurality of semiconductor layers comprising a tunnel junction.

21. An asymmetric vertical cavity surface emitting laser structure comprising:
    a substrate;
    a plurality of semiconductor layers formed on said substrate;
    one of said semiconductor layers comprising an quantum well active layer;

a first reflector comprising Al located on one side of said quantum well active layer and a second reflector located on the opposite side of said quantum well active layer; and one of said semiconductor layers being a non-active layer comprising Al, Ga, As and N, said non-active layer being located between said quantum well active layer and said substrate.

22. The asymmetric vertical cavity surface emitting laser of claim 21 wherein said non-active layer is separated from said quantum well layer by a distance of at least about 200 Å.

23. The asymmetric vertical cavity surface emitting laser structure of claim 21 wherein said non-active layer is located in said first reflector.

24. The asymmetric vertical cavity surface emitting laser structure of claim 21 wherein said non-active layer comprises $GaAs_{1-x}N_x$.

25. The asymmetric vertical cavity surface emitting laser structure of claim 24 wherein the value of x lies between 0 and 0.1.

26. The asymmetric vertical cavity surface emitting laser structure of claim 21 wherein said non-active layer comprising nitrogen has a thickness of about 600 Å.

27. The asymmetric vertical cavity surface emitting laser structure of claim 21 with said quantum well active layer comprising In, Ga, As and N.

* * * * *